(12) United States Patent
Nowell et al.

(10) Patent No.: US 11,916,324 B2
(45) Date of Patent: Feb. 27, 2024

(54) CONNECTING MULTI-CONDUCTOR CABLES WITH SURFACE CONTACTS

(71) Applicant: Cisco Technology, Inc., San Jose, CA (US)

(72) Inventors: Mark C. Nowell, Ottawa (CA); D. Brice Achkir, Livermore, CA (US); Joel R. Goergen, Soulsbyville, CA (US); Giovanni Giobbio, Rovellasca (IT); Mary K. Laue, Atlanta, GA (US)

(73) Assignee: Cisco Technology, Inc., San Jose, CA (US)

( * ) Notice: Subject to any disclaimer, the term of this patent is extended or adjusted under 35 U.S.C. 154(b) by 130 days.

(21) Appl. No.: 17/644,999

(22) Filed: Dec. 17, 2021

(65) Prior Publication Data

US 2023/0010397 A1    Jan. 12, 2023

Related U.S. Application Data

(60) Provisional application No. 63/219,652, filed on Jul. 8, 2021.

(51) Int. Cl.
*H01R 12/72* (2011.01)
*H01R 13/6594* (2011.01)

(52) U.S. Cl.
CPC ....... *H01R 12/721* (2013.01); *H01R 13/6594* (2013.01)

(58) Field of Classification Search
CPC ........................... H01R 12/721; H01R 13/6594
(Continued)

(56) References Cited

U.S. PATENT DOCUMENTS 9,472,878 B2 * 10/2016 Costello ................. H01R 12/79
10,680,364 B2 * 6/2020 Champion ......... H01R 13/6582
(Continued)

FOREIGN PATENT DOCUMENTS

CN          105684224 A      6/2016
WO       2019195319 A1     10/2019
(Continued)

OTHER PUBLICATIONS

U.S. Appl. No. 17/329,043 for CISC/CPOL1030194-US.02 filed May 24, 2021.
(Continued)

*Primary Examiner* — Peter G Leigh
(74) *Attorney, Agent, or Firm* — Patterson + Sheridan, LLP

(57) ABSTRACT

An electrical connector for connecting to an array of surface contacts includes a connector body and a plurality of cable terminators. The connector body defines an interior volume and includes an external surface defining a plurality of cable openings each configured to receive a respective multi-conductor cable therethrough and a plurality of passageways. The plurality of cable terminators are each configured to couple with a respective multi-conductor cable exiting the second section of a respective passageway. Each cable terminator includes a plurality of pins each configured to couple with a respective conductor of the multi-conductor cable and to extend to a respective contact surface. The contact surfaces of the plurality of cable terminators extend to a second plane. The first plane and the second plane are coplanar when the array is in the connection position.

20 Claims, 8 Drawing Sheets

(58) Field of Classification Search
USPC .......................................................... 439/68
See application file for complete search history.

(56) References Cited

U.S. PATENT DOCUMENTS

| | | |
|---|---|---|
| 2015/0357736 A1 | 12/2015 | Tran et al. |
| 2016/0211598 A1* | 7/2016 | Costello ................. H01R 12/73 |
| 2019/0037689 A1* | 1/2019 | Du ......................... H05K 1/115 |
| 2019/0140374 A1 | 5/2019 | Wu et al. |
| 2019/0288422 A1 | 9/2019 | Champion et al. |
| 2020/0233162 A1* | 7/2020 | Yu ........................ G02B 6/4278 |
| 2020/0395716 A1* | 12/2020 | Kim ....................... H01R 12/75 |
| 2022/0115816 A1 | 4/2022 | Huang et al. |

FOREIGN PATENT DOCUMENTS

| | | | | |
|---|---|---|---|---|
| WO | WO-2020076785 A1 * | 4/2020 | ............. | H01R 12/79 |
| WO | 2022147292 A1 | 7/2022 | | |

OTHER PUBLICATIONS

U.S. Appl. No. 17/528,415 for CISC/CPOL1031802-US.02 filed Nov. 17, 2021.
International Search Report for PCT Application No. PCT/US2022/073370, dated Oct. 27, 2022.
Written Opinion of the International Searching Authority for for PCT Application No. PCT/US2022/073370, dated Oct. 27, 2022.

* cited by examiner

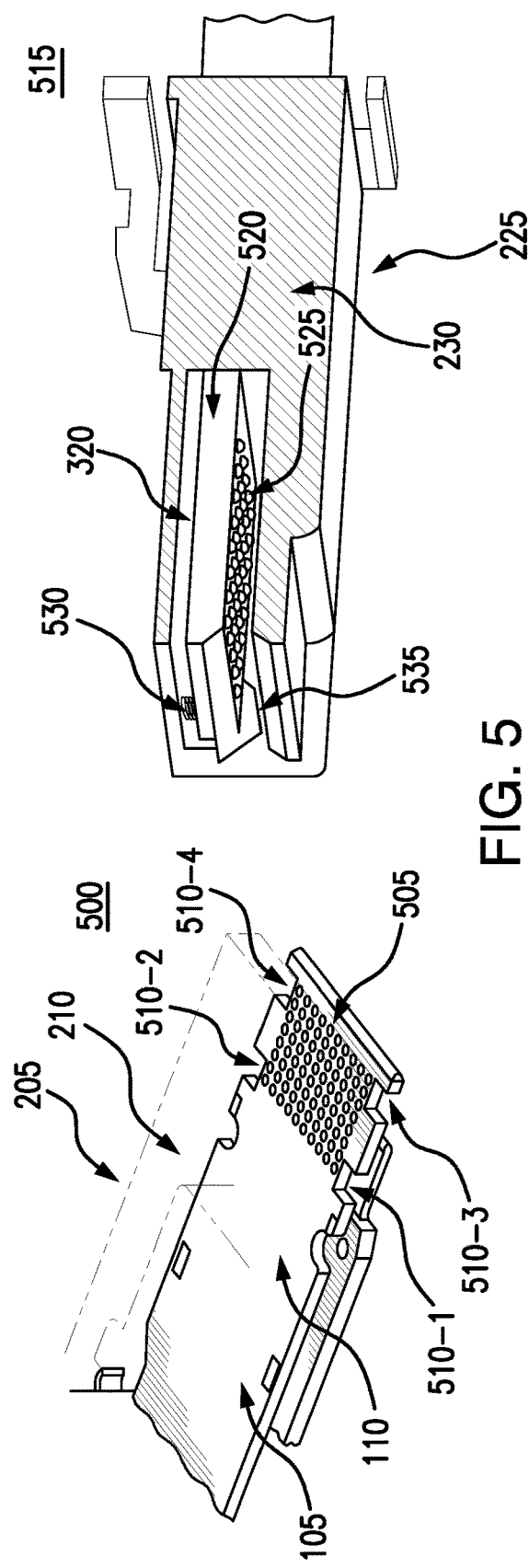
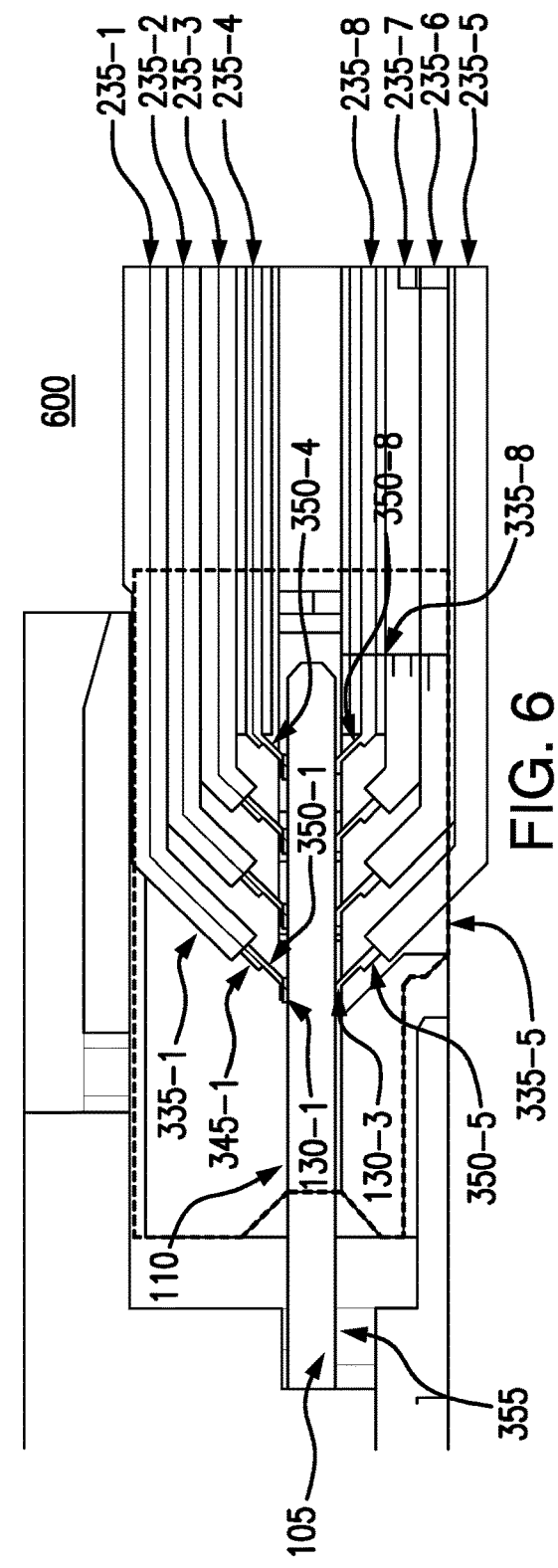
FIG. 5
FIG. 6

CONNECTING MULTI-CONDUCTOR CABLES WITH SURFACE CONTACTS

CROSS-REFERENCE TO RELATED APPLICATIONS

This application claims benefit of U.S. provisional patent application Ser. No. 63/219,652 filed Jul. 8, 2021. The aforementioned related patent application is herein incorporated by reference in its entirety.

TECHNICAL FIELD

Embodiments presented in this disclosure generally relate to electrical connector design, and more specifically, to implementations of electrical connectors capable of connecting multi-conductor cables with one or more arrays of surface contacts.

BACKGROUND

Edge connectors are routinely used to connect electrical cabling with printed circuit boards (PCBs) of networking devices such as pluggable optical modules and pluggable electrical modules. With an increased speeds of the electrical signals to support greater data rates, the performance limitations of existing electrical connectors have become more significant.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

FIG. 5 illustrates complementary features of a printed circuit board and an electrical connector, according to one or more embodiments.

FIG. 6 illustrates connection with surface contacts on opposing surfaces of a printed circuit board, according to one or more embodiments.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1:
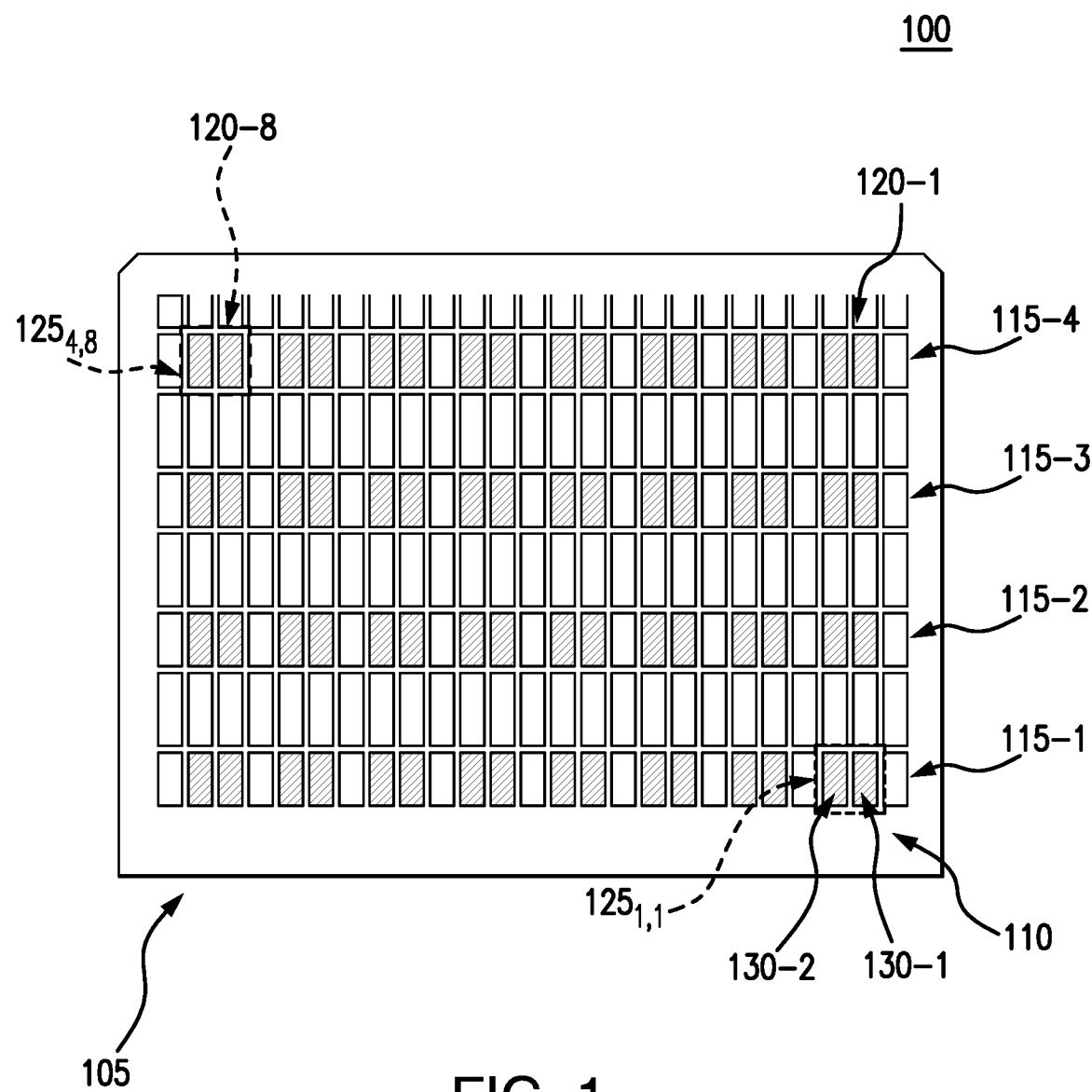
FIG. 1 illustrates an array of surface contacts disposed on a surface of a printed circuit board, according to one or more embodiments.

According to an embodiment, an electrical connector for connecting to an array of surface contacts includes a connector body and a plurality of cable terminators. The connector body defines an interior volume and includes an external surface defining a plurality of cable openings each configured to receive a respective multi-conductor cable therethrough and a plurality of passageways. Each passageway corresponds to a respective cable opening of the plurality of cable openings and includes a respective first section and a respective second section. The respective first section extends into the interior volume from the respective cable opening. The first sections of the plurality of passageways are parallel with each other. The respective second section extends from the respective first section toward a first plane of the surface contacts when the array is received into a connection position in the interior volume. The plurality of cable terminators are each configured to couple with a respective multi-conductor cable exiting the second section of a respective passageway. Each cable terminator includes a plurality of pins each configured to couple with a respective conductor of the multi-conductor cable and to extend to a respective contact surface. The contact surfaces of the plurality of cable terminators extend to a second plane. The first plane and the second plane are coplanar when the array is in the connection position.

According to another embodiment, an edge connector for connecting to an array of surface contacts disposed on a first surface of a printed circuit board (PCB) includes a connector body and a plurality of cable terminators. The connector body defines an interior volume and includes an external surface defining a plurality of cable openings each configured to receive a respective multi-conductor cable therethrough and a plurality of passageways each extending, from a first end at a respective cable opening of the plurality of cable openings, to an opposing second end in the interior volume and spaced apart from the first surface when the PCB is received into a connection position in the interior volume. Some or all of the plurality of passageways extend toward the first surface. The plurality of cable terminators are each configured to couple with a respective multi-conductor cable exiting a respective passageway. Each cable terminator includes a plurality of pins each configured to couple with a respective conductor of the multi-conductor cable and to extend to a respective contact surface. The contact surfaces of the plurality of cable terminators extend to a plane. The contact surfaces contact the array of surface contacts when the PCB is in the connection position.

According to another embodiment, a cap connector for connecting to an array of surface contacts disposed on a base includes a connector body and a plurality of cable terminators. The connector body defines an interior volume and includes an external surface defining a plurality of cable openings each configured to receive a respective multi-conductor cable therethrough and a plurality of passageways each extending, from a first end at a respective cable opening of the plurality of cable openings, to an opposing second end in the interior volume and spaced apart from the array of surface contacts when the base is received into the interior volume to arrange the array in a connection position in the interior volume. Some or all of the plurality of passageways extend toward the array. The plurality of cable terminators are each configured to couple with a respective multi-conductor cable exiting a respective passageway. Each cable terminator includes a plurality of pins each configured to couple with a respective conductor of the multi-conductor cable and to extend to a respective contact surface. The contact surfaces of the plurality of cable terminators extend to a plane. The contact surfaces contact the array when the array is in the connection position.

Example Embodiments

According to one or more embodiments, an electrical connector is disclosed for connecting to an array of surface contacts. The electrical connector comprises a connector body defining an interior volume. The connector body comprises an external surface defining a plurality of cable openings each configured to receive a respective multi-conductor cable therethrough, and a plurality of passageways each corresponding to a respective cable opening of the plurality of cable openings. Each passageway comprises a respective first section extending into the interior volume from the respective cable opening, where the first sections of the plurality of passageways are parallel with each other. Each passageway further comprises a respective second section extending from the respective first section toward a first plane of the surface contacts when the array is received into a connection position in the interior volume. The electrical connector further comprises a plurality of cable terminators each configured to couple with a respective multi-conductor cable exiting the second section of a respective passageway. Each cable terminator comprises a plurality of pins each configured to couple with a respective conductor of the multi-conductor cable and to extend to a respective contact surface. The contact surfaces of the plurality of cable terminators extend to a second plane that is coplanar with the first plane when the array is in the connection position.

Within the electrical connector, the first sections and second sections of the passageways provide a "flyover" configuration of the multi-conductor cables, which generally permits the multi-conductor cables to be spaced further apart from the surface contacts and any other components at or near the surface. Thus, the flyover configuration tends to provide improved signal integrity when transmitting higher-speed electrical signals. The flyover configuration further allows the surface contacts and the electrical connector to be scaled to support greater channel counts (e.g., a two-dimensional array of surface contacts) and/or greater contact density. The flyover configuration further supports fewer transitions between the multi-conductor cables and the surface contacts, which improves signal integrity.

In some embodiments, the array of surface contacts are disposed on a first surface of a printed circuit board (PCB), such as a top surface. The PCB may include a second array of surface contacts disposed on a second surface opposite the first surface, and the electrical connector may include a second plurality of cable terminators that contact the second array of the surface contacts. In some embodiments, the array of surface contacts are disposed on a top surface of an integrated circuit (IC) or of another base.

In some embodiments, a compressive force is applied between the plurality of cable terminators and the array of surface contacts when the array is in the connection position.

For example, the cable terminators may use a spring-like termination (e.g., land grid array (LGA)-style) and contact an edge of the PCB that has been inserted into the connector to align the array of surface contacts with the cable terminators.

FIG. 1 illustrates an array of surface contacts disposed on a surface of a printed circuit board (PCB) 105. More specifically, diagram 100 provides a top view of a first surface 110 of a PCB 105, such that the first surface 110 is a top surface of the PCB 105. In alternate embodiments, the first surface 110 may be a bottom surface of the PCB 105. In alternate embodiments, the first surface 110 may represent a surface of an integrated circuit, a base, a platform, and so forth.

The first surface 110 comprises an array of surface contacts at a plurality of locations $125_{1,1}, \ldots, 125_{4,8}$. As shown, the plurality of locations $125_{1,1}, \ldots, 125_{4,8}$ are arranged as a rectangular array of four (4) rows 115-1, ..., 115-4 and eight (8) columns 120-1, ..., 120-8. Each of the locations $125_{1,1}, \ldots, 125_{4,8}$ comprises multiple surface contacts 130-1, 130-2 for connecting to conductors of a respective multi-conductor cable, e.g., a twinaxial (or "twinax") cable. In some embodiments, the conductors of the multi-conductor cable provide differential signaling with the surface contacts 130-1, 130-2.

Alternate implementations of the array may include other numbers and/or arrangements of the locations $125_{1,1}, \ldots, 125_{4,8}$. For example, the locations $125_{1,1}, \ldots, 125_{4,8}$ may be arranged in staggered rows and/or columns, in radial patterns, and other regular or irregular patterns. Alternate implementations of the array may include other numbers and/or arrangements of the surface contacts 130-1, 130-2 within the respective locations $125_{1,1}, \ldots, 125_{4,8}$. For example, each of the locations $125_{1,1}, \ldots, 125_{4,8}$ may include an additional surface contact that connects with a ground conductor of the multi-conductor cable.

As will be discussed in greater detail below, the configuration of the multi-conductor cables in the electrical connector enables a greater number and/or a greater density of the surface contacts 130-1, 130-2. In one non-limiting example, the surface contacts 130-1, 130-2 have a height of about 1 mm (e.g., along a direction of the corresponding column 120-1, ..., 120-8) and a width of about 0.5 mm (e.g., along a direction of the corresponding row 115-1, ..., 115-4). Within a particular row 115-1, ..., 115-4, the surface contacts 130-1, 130-2 at a particular location $125_{1,1}, \ldots, 125_{4,8}$ have a pitch of about 0.6 mm, and the locations $125_{1,1}, \ldots, 125_{4,8}$ have a pitch of about 1.8 mm. Within a particular column 120-1, ..., 120-8, the locations $125_{1,1}, \ldots, 125_{4,8}$ have a pitch of about 2.75 mm. Different dimensions of the surface contacts 130-1, 130-2 and/or different pitches are also contemplated.

Figure 2:
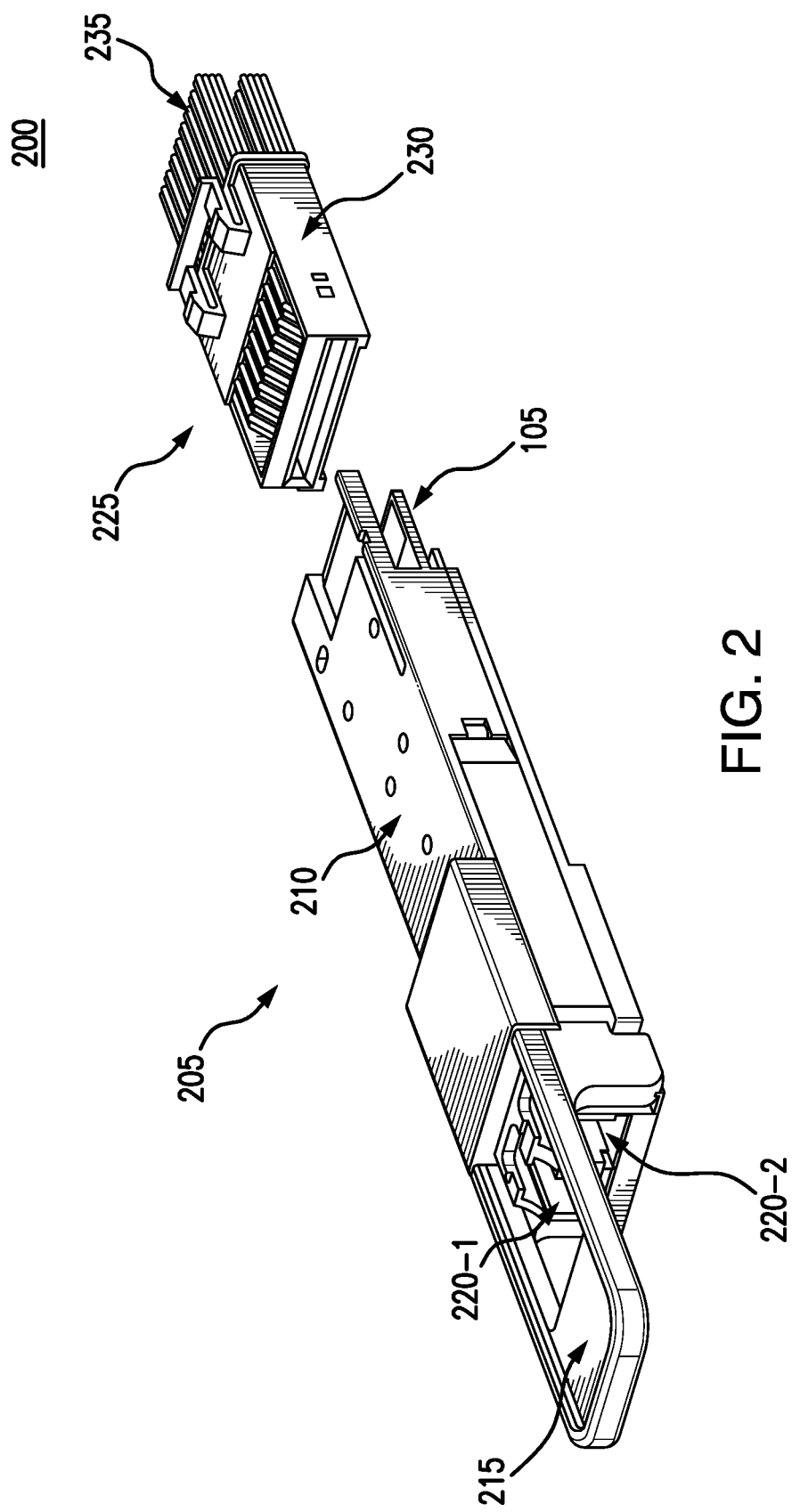
FIG. 2 illustrates an unconnected configuration of a pluggable optical module and an edge connector, according to one or more embodiments.

In diagram 200 of FIG. 2, a pluggable optical module 205 and an edge connector 225 are illustrated in an unconnected configuration. The pluggable optical module 205 comprises a body 210 that encloses one or more electrical components and/or optical components that collectively perform any suitable functions. In some embodiments, the pluggable optical module 205 operates as a transceiver module. In some embodiments, one or more external surfaces of the body 210 slidingly engage with one or more internal surfaces of a network device to align the pluggable optical module 205 while being plugged into the network device. The PCB 105 is coupled with the electrical component(s) and/or the optical component(s) and extends from the body 210, such that the surface contacts on the first surface 110 are exposed and are able to be received into the edge connector 225.

The PCB 105 extends from a first end of the body 210 (e.g., an inserted end of the pluggable optical module 205), and a handle 215 extends from an opposing second end of the body 210. The handle 215 may be manipulated by a user to insert and/or remove the pluggable optical module 205 in the network device. Two (2) external ports 220-1, 220-2 are arranged at the second end of the body 210 and provide an external connectivity with the electrical component(s) and/or the optical component(s). Other numbers and/or configurations of the external ports 220-1, 220-2 are also contemplated.

The edge connector 225 comprises a connector body 230 that defines an interior volume into which the PCB 105 may be received. The connector body 230 is further configured to receive a plurality of multi-conductor cables 235 that extend from an external surface of the connector body 230 into the interior volume. Each of the multi-conductor cables 235 may include two conductors (e.g., a twinax cable) or more. As shown, the PCB 105 is received into a first end of the connector body 230, and the multi-conductor cables 235 are received into an opposing second end of the connector body 230.

Figure 3A:
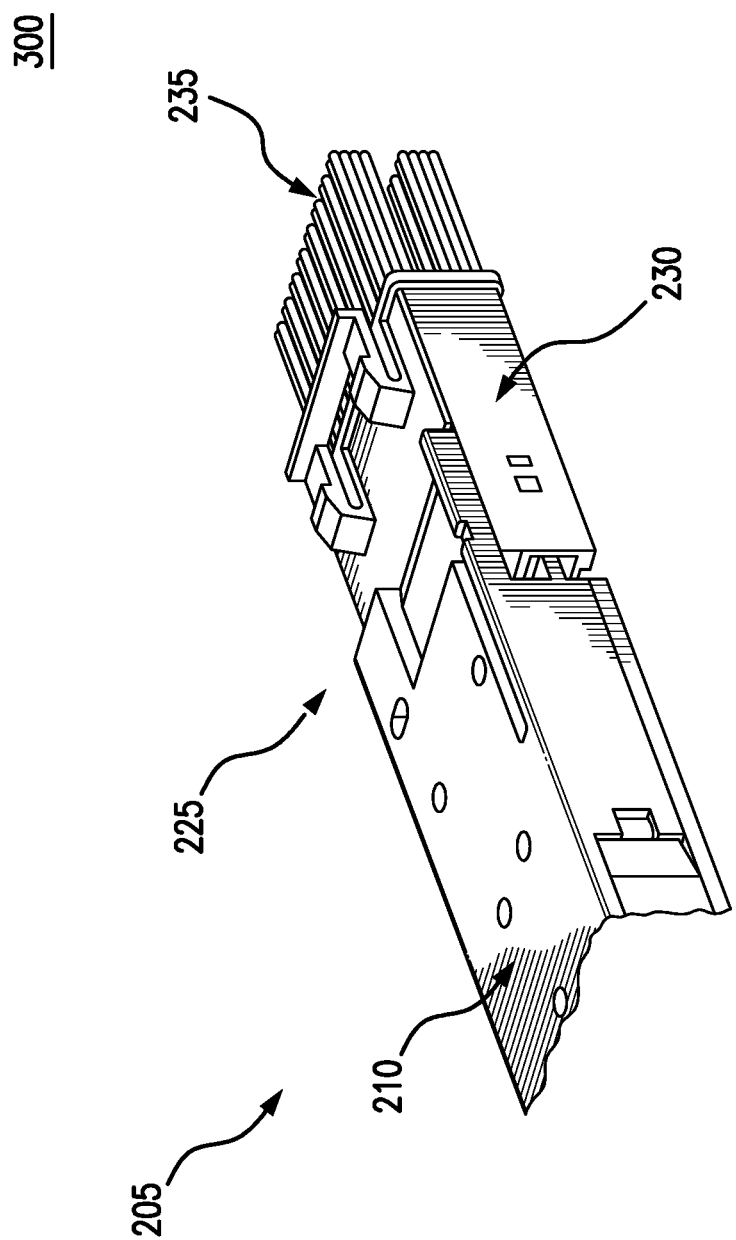
FIG. 3A is a perspective view.
Figure 3B:
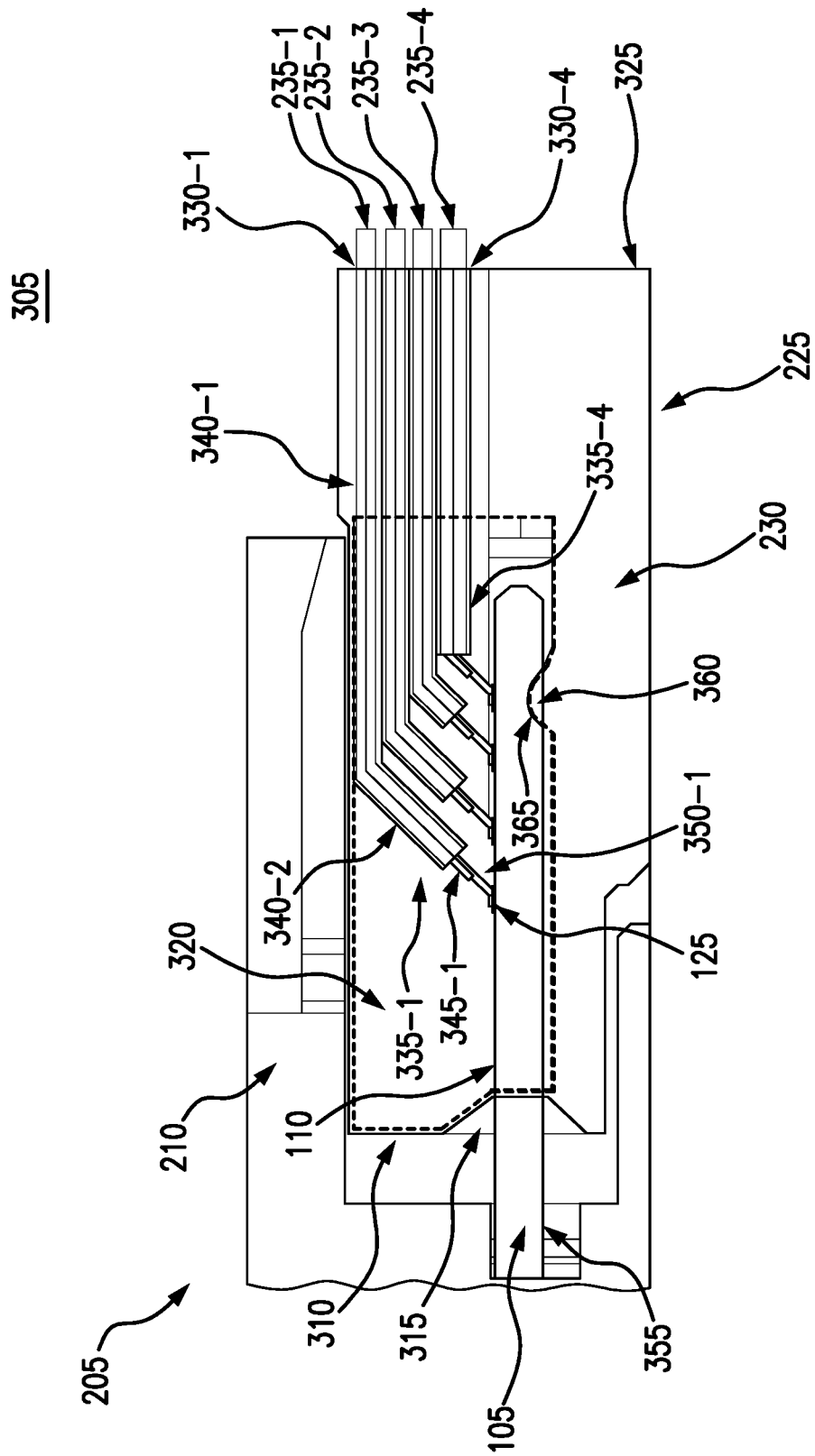
FIG. 3B is a cross-section view, of a connected configuration of a pluggable optical module and an edge connector, according to one or more embodiments.

Diagram 300 of FIG. 3A provides a perspective view, and diagram 305 of FIG. 3B provides a cross-section view, of the pluggable optical module 205 and the edge connector 225 in a connected configuration. The connector body 230 is contoured to define an interior volume 320. The connector body 230 comprises a first surface 310 having an opening 315 through which the PCB 105 is received into the interior volume 320. In some embodiments, the first surface 310 is tapered to the opening 315 to accommodate receiving the PCB 105.

The PCB 105 is received to a connection position in the interior volume 320. At a second surface 355 (e.g., a bottom surface) of the PCB 105 opposite the first surface 110, a groove 365 receives a ridge 360 of the connector body 230 to retain the PCB 105 in the connection position.

Multi-conductor cables 235-1, 235-2, . . . , 235-4 are received into the connector body 230 through respective cable openings 330-1, . . . , 330-4 at an external surface 325 of the connector body 230. As shown, the external surface 325 is at an end of the connector body 230 opposite the first surface 310.

The connector body 230 comprises a plurality of passageways 335-1, . . . , 335-4 extending from the external surface 325 to the interior volume 320. Each multi-conductor cable 235-1, 235-2, . . . , 235-4 is received in a respective passageway 335-1, . . . , 335-4. As shown, the connector body 230 comprises a plurality of tubular members and the passageways 335-1, . . . , 335-4 are defined as openings of the tubular members. In alternate embodiments, the passageways 335-1, . . . , 335-4 are defined as openings formed through a monolithic structure of the connector body 230. The openings through the tubular members or the monolithic structure may have an inner diameter (or contour) that is matched to an outer diameter (or contour) of the multi-conductor cables 235-1, 235-2, . . . , 235-4. In other alternate embodiments, the passageways 335-1, . . . , 335-4 are defined through a grid structure of the connector body 230. The openings of the grid structure may match, but need not be matched, to the multi-conductor cables 235-1, 235-2, . . . , 235-4. In this way, the plurality of passageways 335-1, . . . , 335-4 retain the multi-conductor cables 235-1, 235-2, . . . , 235-4 to limit or prevent movement of the multi-connector cables 235-1, 235-2, . . . , 235-4 when connected to the array of surface contacts 130-1, 130-2.

In some embodiments, each of the passageways 335-1, . . . , 335-4 comprises a respective first section 340-1 extending into the interior volume 320 from the respective cable opening 330-1, . . . , 330-4, and a respective second section 340-2 extending from the respective first section 340-1 toward a first plane of the surface contacts 130-1, 130-2 (e.g., a plane of the first surface 110) when the array of surface contacts 130-1, 130-2 is received into the connection position.

Figure 4:
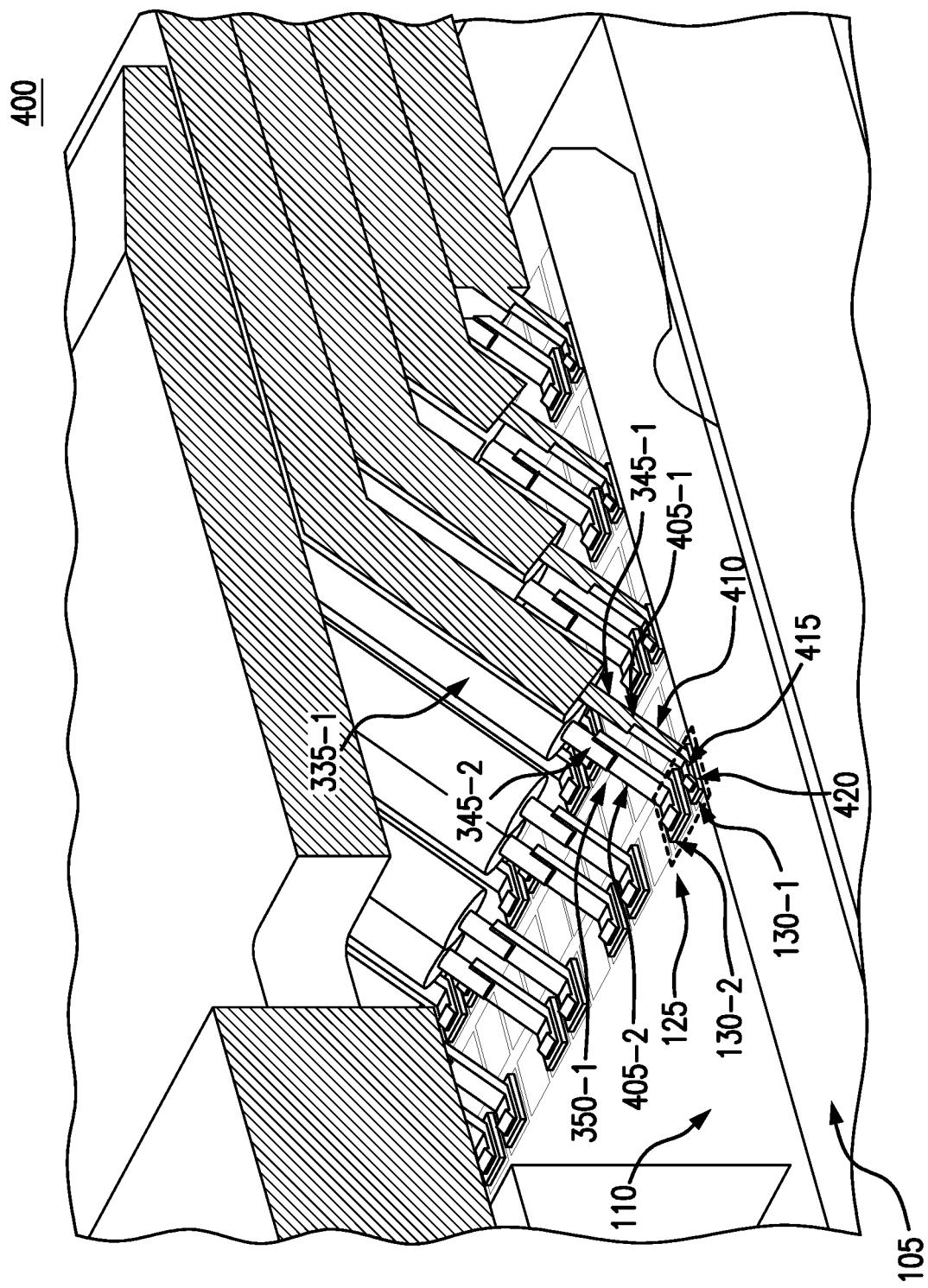
FIG. 4 illustrates connection of cable terminators with an array of surface contacts in a connection position, according to one or more embodiments.

The edge connector 225 further comprises a plurality of cable terminators 350-1 that are each configured to couple with a respective multi-conductor cable 235-1, . . . , 235-4 exiting the second section 340-2 of a respective passageway 335-1, . . . , 335-4. As shown in greater detail in diagram 400 of FIG. 4, each cable terminator 350-1 comprises a plurality of pins 405-1, 405-2 that couple with a respective conductor 345-1, 345-2 of the multi-conductor cable and that extend to a respective contact surface 420. The contact surfaces 420 of the plurality of cable terminators 350-1 extend to a second plane. The first plane and the second plane are coplanar when the array of the surface contacts 130-1, 130-2 is in the connection position, such that the cable terminators 350-1 contact the array of the surface contacts 130-1, 130-2.

In some embodiments, the first sections 340-1 of the passageways 335-1, . . . , 335-4 and the second sections 340-2 of the passageways 335-1, . . . , 335-4 are straight sections. In some embodiments, the first sections 340-1 are parallel to the plane of the first surface 110. In other embodiments, the first sections 340-1 and/or the second sections 340-2 may be curved sections. In some embodiments, the first sections 340-1 of the passageways 335-1, . . . , 335-4 are parallel with each other. In some embodiments, the second sections 340-2 of the passageways 335-1, . . . , 335-4 are parallel with each other. The dimensioning of the first sections 340-1 and the second sections 340-2, as well as the relative angle(s) between the first sections 340-1 and the second sections 340-2, may be selected to provide a pitch of the contact surfaces 420 to correspond to the pitch of the surface contacts 130-1, 130-2. Further, in some embodiments, one or more of the passageways 335-1, . . . , 335-4 may omit the second sections 340-2 to provide the desired pitch of the contact surface 420. Further, the arrangement of the contact surfaces 420 may be selected to permit the edge connector 225 to connect with legacy implementations of the pluggable optical module 205 (e.g., including a single row of the surface contacts 130-1, 130-2).

Within the edge connector 225, the first sections 340-1 and second sections 340-2 of the passageways provide a "flyover" configuration of the multi-conductor cables 235-1, . . . , 235-4, which generally permits the multi-conductor cables 235-1, . . . , 235-4 to be spaced further apart from the surface contacts 130-1, 130-2 and any other components at or near the first surface 110.

In some embodiments, for each cable terminator 350-1, each pin 405-1, 405-2 comprises a leg 410 and a foot 415 extending from the leg 410. In some embodiments, the foot 415 defines the contact surface 420 in the second plane. In some embodiments, the leg 410 of the cable terminators 350-1 extends parallel to an axis of the second section 340-2 of the respective passageway 335-1, . . . , 335-4. In some embodiments, the foot 415 extends parallel to the plane of the first surface 110. In certain embodiments, the leg 410 extends at a non-normal angle to the plane of the contact surface 420 such that the leg 410 does not extend parallel with the normal of the plane of the contact surface 420. For example, the leg 410 may extend at a 30° angle, 45° angle, 60° angle, or any angle less than 90° from the plane of the contact surface 420.

In some embodiments, a compressive force is applied between the plurality of cable terminators 350-1 and the array of surface contacts 130-1, 130-2 when the array is in the connection position. For example, the pins 405-1, 405-2 may be land-grid array (LGA) pins and the mechanical tolerances of the edge connector 225 may be selected so that the array of surface contacts 130-1, 130-2 can slide beneath the pins 405-1, 405-2. In another example, the edge connector 225 may include a feature that displaces the first surface 110 (e.g., the PCB 105) toward the second plane of the plurality of cable terminators 350-1 as the PCB 105 approaches the connection position in the interior volume 320.

In another example, the edge connector 225 may include springs or other biasing members that apply a force to the respective multi-conductor cables 235-1, ..., 235-4 toward the first plane of the surface contacts 130-1, 130-2. As shown in diagrams 500, 515 of FIG. 5, the PCB 105 of the pluggable optical module 205 comprises an array of surface contacts 505 on the first surface 110 (e.g., upper surface). The PCB 105 further defines a plurality of lateral notches 510-1, ..., 510-4 that each extend down from the first surface 110. As shown, the lateral notches 510-1, ..., 510-4 extend fully through the PCB 105; however, in other implementations the lateral notches 510-1, ..., 510-4 extend partly through the PCB 105 (e.g., the PCB 105 has a reduced thickness at the lateral notches 510-1, ..., 510-4).

In the diagram 515, the edge connector 225 includes a monolithic member 520 that is deformable or pivotable within the interior volume 320. The plurality of passageways 335-1, ..., 335-4 extend through the monolithic member 520, and the cable terminators 350-1 extend to a bottom surface 525 of the monolithic member 520. The monolithic member 520 includes one or more ridges 535 at the bottom surface 525. One or more springs 530 contact another surface of the edge connector 225 and bias the monolithic member 520 in a downward direction. As the PCB 105 is received into the interior volume 320, the one or more ridges 535 slide along the first surface 110 of the PCB 105. The one or more ridges 535 are received by one or more second features of the PCB 105 (e.g., the lateral notches 510-1, ..., 510-4) at the connection position, which lowers the plane of the cable terminators 350-1 to be coplanar with the plane of the array of the surface contacts 505.

In some embodiments, and as shown in diagram 600 of FIG. 6, the PCB 105 further comprises a second array of surface contacts 130-3 disposed on the second surface 355 (e.g., a bottom surface) opposite the first surface 110, and the connector body 230 further comprises a second plurality of passageways 335-5, ..., 335-8 extending into the interior volume 320 from a second plurality of cable openings (e.g., at the external surface 325). In such cases, the edge connector 225 further comprises a second plurality of cable terminators 350-5, ..., 350-8 each configured to couple with a respective multi-conductor cable 235-5, ..., 235-8 exiting a respective passageway of the second plurality of passageways 335-5, ..., 335-8. A third plane of the second array of surface contacts (e.g., the second surface 355) is coplanar with a fourth plane of the contact surfaces of the second plurality of cable terminators 350-5, ..., 350-8 when the second array is received into the connection position. In some embodiments, a compressive force is applied between the second plurality of cable terminators 350-5, ..., 350-8 and the second array of surface contacts 130-3, e.g., as the PCB 105 approaches the connection position.

Figure 7:
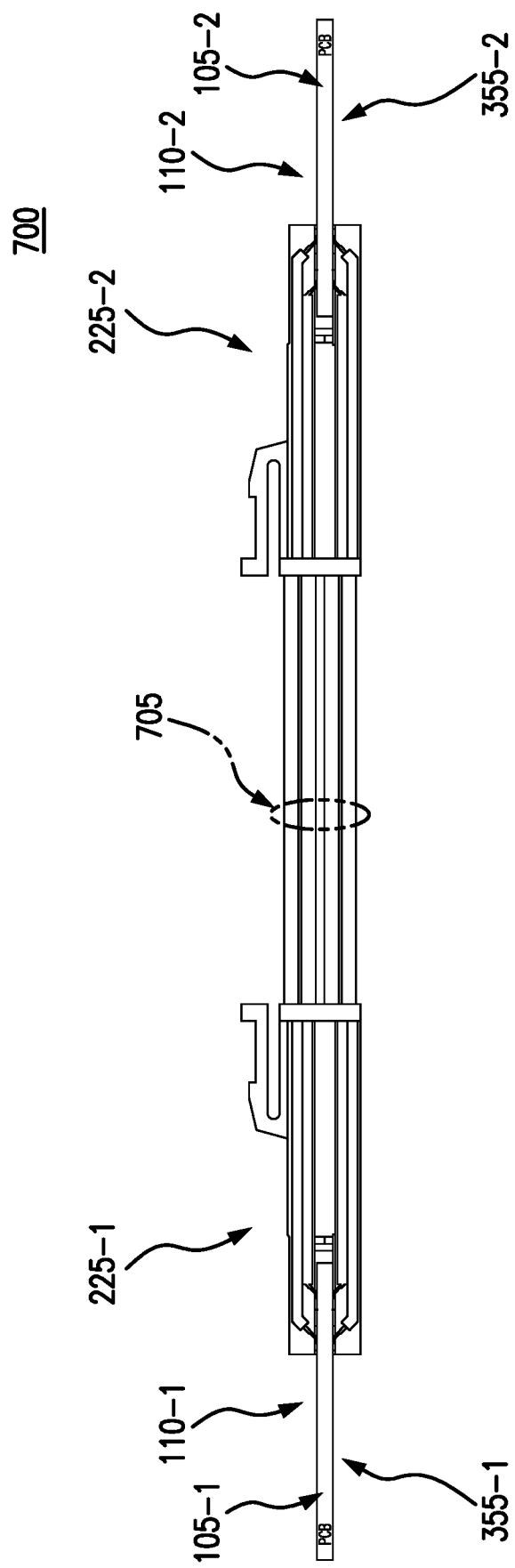
FIG. 7 illustrates connection between printed circuit boards, according to one or more embodiments.

FIG. 7 is a diagram 700 illustrating connection between PCBs 105-1, 105-2. The features in the diagram 700 may be used in conjunction with other embodiments. A first edge connector 225-1 includes a first plurality of cable terminators coupled to surface contacts of a first surface 110-1 and to surface contacts of a second surface 355-1 of a first PCB 105-1, and a second edge connector 225-2 includes a second plurality of cable terminators coupled to surface contacts of a first surface 110-2 and to surface contacts of a second surface 355-2 of a second PCB 105-2. A plurality of multi-conductor cables 705 are connected between the first plurality of cable terminators of the first edge connector 225-1 and the second plurality of cable terminators of second edge connector 225-2.

In some embodiments, the arrangement illustrated in the diagram 700 may be implemented as a cabled backplane of a network device. In some embodiments, the arrangement illustrated in the diagram 700 may be implemented to connect a motherboard and a daughterboard of a network device. Other implementations using multiple edge connectors 225-1, 225-2 are also contemplated.

Figure 8:
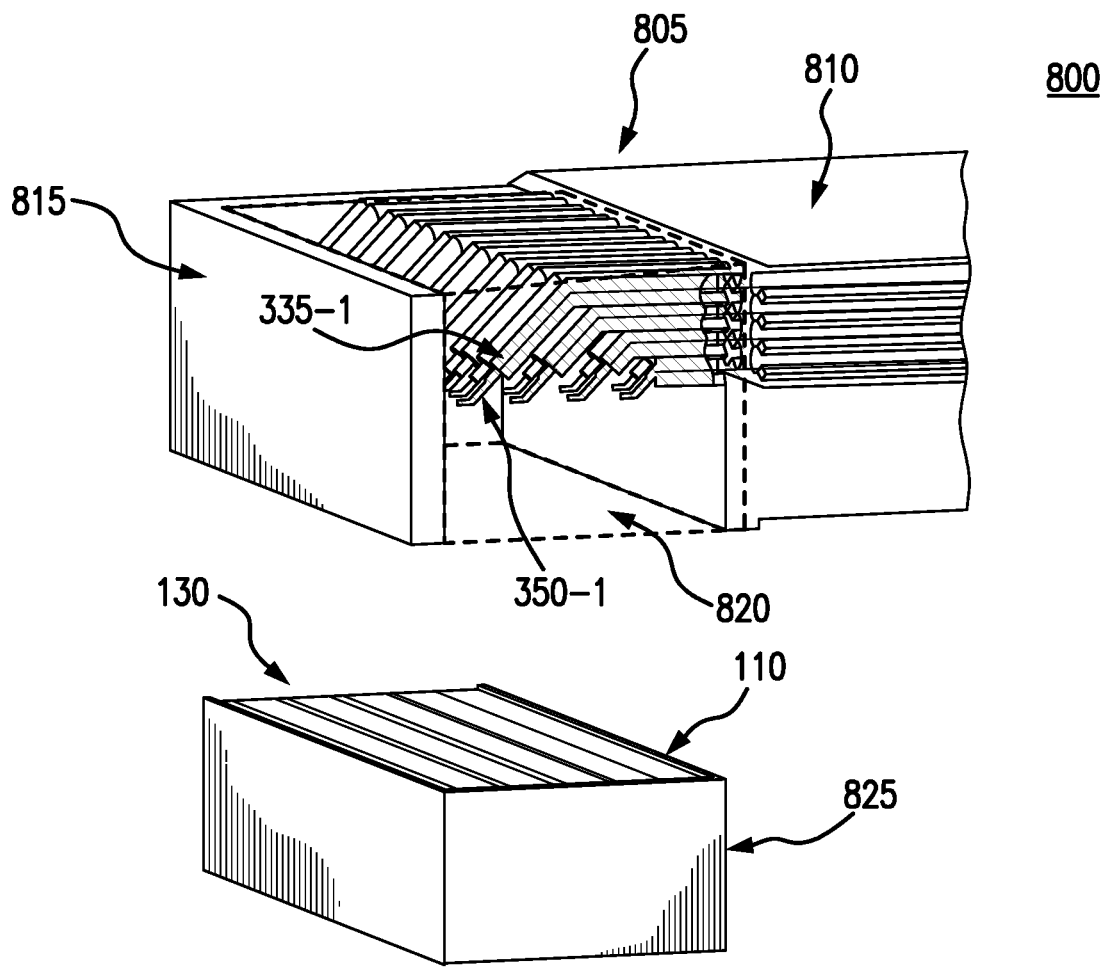
FIG. 8 illustrates an unconnected configuration of an array of surface contacts disposed on a base and a cap connector, according to one or more embodiments.
Figure 9:
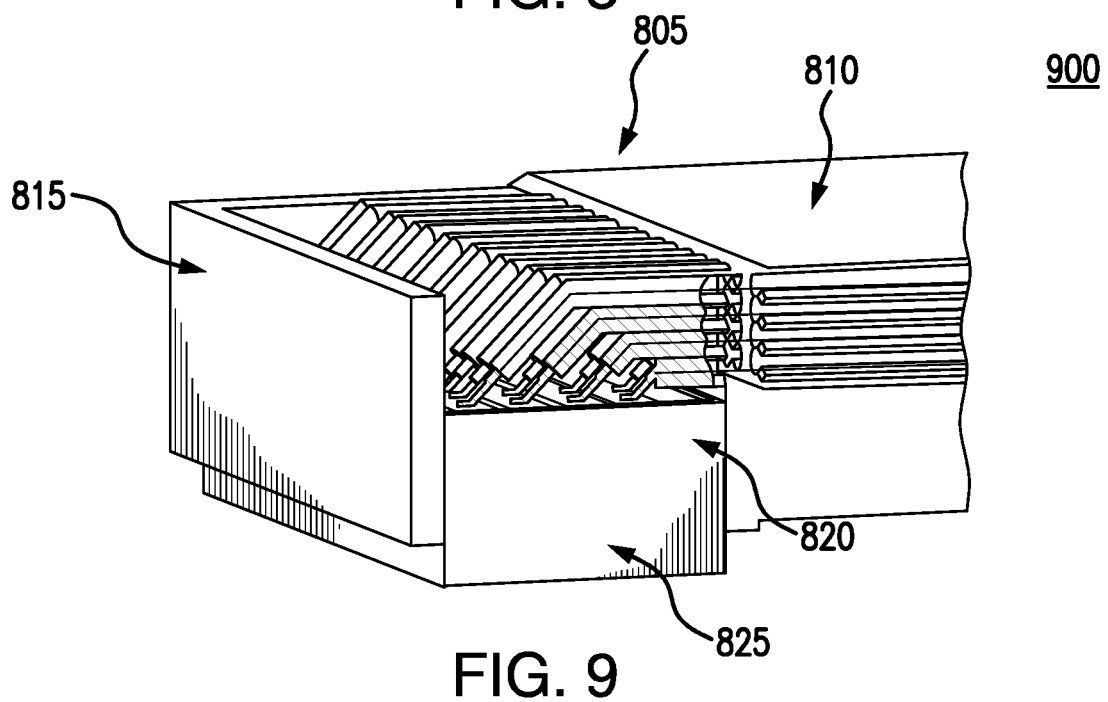
FIG. 9 illustrates a connected configuration of an array of surface contacts disposed on a base and a cap connector, according to one or more embodiments.

Diagram 800 of FIG. 8 illustrates an unconnected configuration, and diagram 900 of FIG. 9 illustrates a connected configuration, of an array of surface contacts 130 disposed on a base 825 and a cap connector 805. The cap connector 805 comprises a connector body 810 defining a plurality of passageways 335-1 that receive multi-conductor cables 235-1, 235-2, ..., 235-4. The connector body 810 further comprises a plurality of walls 815 that define an interior volume 820 of the cap connector 805. The plurality of passageways 335-1 and the cable terminators 350-1 extend into the interior volume 820.

The base 825 may have any suitable implementation providing suitable height for the cap connector 805 to be seated on the base 825 and connect to the array of surface contacts 130. In some embodiments, the base 825 comprises an integrated circuit. In other embodiments, the base 825 comprises a platform or other structure that raises the first surface 110. In some embodiments, the walls 815 may provide one or more contacting surfaces that align the cap connector 805 with the base 825. In some embodiments, the walls 815 and/or base 825 may include guide features that align the cap connector 805 with the base 825.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," or "at least one of A or B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, the embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Program code embodied on a computer readable medium may be transmitted using any appropriate medium, including but not limited to wireless, wireline, optical fiber cable, RF, etc., or any suitable combination of the foregoing.

Computer program code for carrying out operations for embodiments of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatuses (systems), and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block(s) of the flowchart illustrations and/or block diagrams.

These computer program instructions may also be stored in a computer readable medium that can direct a computer, other programmable data processing apparatus, or other device to function in a particular manner, such that the instructions stored in the computer readable medium produce an article of manufacture including instructions which implement the function/act specified in the block(s) of the flowchart illustrations and/or block diagrams.

The computer program instructions may also be loaded onto a computer, other programmable data processing apparatus, or other device to cause a series of operational steps to be performed on the computer, other programmable apparatus or other device to produce a computer implemented process such that the instructions which execute on the computer, other programmable data processing apparatus, or other device provide processes for implementing the functions/acts specified in the block(s) of the flowchart illustrations and/or block diagrams.

The flowchart illustrations and block diagrams in the Figures illustrate the architecture, functionality, and operation of possible implementations of systems, methods, and computer program products according to various embodiments. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

We claim:

1. An electrical connector for connecting to an array of surface contacts, the electrical connector comprising:
    a connector body defining an interior volume, the connector body comprising:
        an external surface defining a plurality of cable openings each configured to receive a respective multi-conductor cable therethrough; and
        a first plurality of passageways, wherein each passageway corresponds to a respective cable opening of the plurality of cable openings and comprises:
            a respective first section extending into the interior volume from the respective cable opening, wherein the first sections of the first plurality of passageways are parallel with each other; and
            a respective second section extending from the respective first section toward a first plane of the surface contacts when the array is received into a connection position in the interior volume; and
    a plurality of cable terminators each configured to couple with a respective multi-conductor cable exiting the second section of a respective passageway, wherein each cable terminator comprises a first pin and a second pin, wherein the first pin is configured to couple with a first conductor of the respective multi-conductor cable and to extend to a first contact surface, wherein the second pin is configured to couple with a second conductor of the respective multi-conductor cable and to extend to a second contact surface, wherein the first contact surface and the second contact surface extend to a second plane,
    wherein the first plane and the second plane are coplanar when the array is in the connection position.

2. The electrical connector of claim 1, wherein the array of surface contacts are disposed on a first surface of a printed circuit board (PCB).

3. The electrical connector of claim 2,
    wherein the PCB further comprises a second array of surface contacts disposed on a second surface opposite the first surface, wherein the connector body further comprises a second plurality of passageways extending into the interior volume from a second plurality of cable openings, wherein the electrical connector further comprises a second plurality of cable terminators each configured to couple with a respective multi-conductor cable exiting a respective passageway of the second plurality of passageways, wherein a third plane of the second array of surface contacts is coplanar with a fourth plane of contact surfaces of the second plurality of cable terminators when the second array is received into the connection position.

4. The electrical connector of claim 2, wherein the PCB is disposed in a pluggable optical module.

5. The electrical connector of claim 2, wherein the connector body further comprises one or more first features configured to slidingly contact the first surface of the PCB as the PCB is received into the interior volume, and to be received by one or more second features of the PCB at the connection position, and wherein the electrical connector further comprises:
one or more springs coupled to the connector body and configured to urge the second plane of the contact surfaces toward the first plane when the one or more first features are received by the one or more second features.

6. The electrical connector of claim 1, wherein the connector body is contoured to, as the array is received in the interior volume toward the connection position, gradually urge the second plane of the contact surfaces toward the first plane.

7. The electrical connector of claim 1, wherein a compressive force is applied between the plurality of cable terminators and the array of surface contacts when the array is in the connection position.

8. The electrical connector of claim 1, wherein the array of surface contacts are included on a top surface of an integrated circuit (IC).

9. The electrical connector of claim 1, wherein the external surface is perpendicular to the first sections.

10. The electrical connector of claim 1, wherein the second sections of the plurality of passageways are parallel with each other.

11. The electrical connector of claim 1, wherein the array of surface contacts comprises a plurality of rows.

12. The electrical connector of claim 1, wherein for each cable terminator, each of the first pin and the second pin comprises a leg extending parallel to an axis of the second section of the respective passageway.

13. The electrical connector of claim 12, wherein each of the first pin and the second pin further comprises a foot extending from the leg and defining the contact surface in the second plane.

14. The electrical connector of claim 1, wherein the connector body further comprises:

a second plurality of passageways, wherein each passageway of the second plurality of passageways corresponds to a respective cable opening of the plurality of cable openings and comprises:
a respective first section extending into the interior volume from the respective cable opening, wherein the first sections of the second plurality of passageways are parallel with each other and with the first sections of the first plurality of passageways; and a second plurality of cable terminators each configured to couple with a respective multi-conductor cable exiting the first section of a respective passageway of the second plurality of passageways, wherein each cable terminator comprises a plurality of pins each configured to couple with a respective conductor of the multi-conductor cable and to extend to a respective contact surface, wherein the contact surfaces of the second plurality of cable terminators extend to the second plane.

15. An edge connector for connecting to an array of surface contacts disposed on a first surface of a printed circuit board (PCB), the edge connector comprising:

a connector body defining an interior volume, the connector body comprising:
an external surface defining a plurality of cable openings each configured to receive a respective multi-conductor cable therethrough; and
a plurality of passageways each extending, from a first end at a respective cable opening of the plurality of cable openings, to an opposing second end in the interior volume and spaced apart from the first surface when the PCB is received into a connection position in the interior volume, wherein some or all of the plurality of passageways extend toward the first surface; and a plurality of cable terminators each configured to couple with a respective multi-conductor cable exiting a respective passageway, wherein each cable terminator comprises a first pin and a second pin, wherein the first pin is plurality of pins each configured to couple with a first conductor of the respective multi-conductor cable and to extend to a first contact surface, wherein the second pin is configured to couple with a second conductor of the respective multi-conductor cable and to extend to a second contact surface, wherein the first contact surface and the second contact surface extend to a plane, wherein the contact surfaces contact the array of surface contacts when the PCB is in the connection position.

16. The edge connector of claim 15, wherein a compressive force is applied between the plurality of cable terminators and the array of surface contacts when the PCB is in the connection position.

17. The edge connector of claim 15, wherein for each cable terminator, each of the first pin and the second pin comprises:
a leg extending at a non-normal angle to the plane of the contact surfaces; and
a foot extending from the leg and defining the contact surface in the plane.

18. A cap connector for connecting to an array of surface contacts disposed on a base, the cap connector comprising:
a connector body defining an interior volume, the connector body comprising:
an external surface defining a plurality of cable openings each configured to receive a respective multi-conductor cable therethrough; and
a plurality of passageways each extending, from a first end at a respective cable opening of the plurality of cable openings, to an opposing second end in the interior volume and spaced apart from the array of surface contacts when the base is received into the interior volume to arrange the array in a connection position in the interior volume, wherein some or all of the plurality of passageways extend toward the array; and a plurality of cable terminators each configured to couple with a respective multi-conductor cable exiting a respective passageway, wherein each cable terminator comprises a first pin and a second pin, wherein the first pin is plurality of pins each configured to couple with a first conductor of the respective multi-conductor cable and to extend to a first contact surface, wherein the second pin is configured to couple with a second conductor of the respective multi-conductor cable and to extend to a second contact surface, wherein the first contact surface and the second contact surface extend to a plane, wherein the contact surfaces contact the array when the array is in the connection position.

19. The cap connector of claim 18, wherein the connector body is contoured to slidingly contact one or more external surfaces of the base as the base is received into the interior volume.

20. The cap connector of claim 18, wherein a compressive force is applied between the plurality of cable terminators and the array of surface contacts when the array is in the connection position.

\* \* \* \* \*

UNITED STATES PATENT AND TRADEMARK OFFICE
CERTIFICATE OF CORRECTION

| | |
|---|---|
| PATENT NO. | : 11,916,324 B2 |
| APPLICATION NO. | : 17/644999 |
| DATED | : February 27, 2024 |
| INVENTOR(S) | : Mark C. Nowell et al. |

It is certified that error appears in the above-identified patent and that said Letters Patent is hereby corrected as shown below:

In the Claims

In Column 12, Line 31, in Claim 15, delete "is plurality of pins each" and insert -- is --.

In Column 13, Line 5, in Claim 18, delete "is plurality of pins each" and insert -- is --.

Signed and Sealed this
Third Day of September, 2024

Katherine Kelly Vidal
*Director of the United States Patent and Trademark Office*